(12) United States Patent
Kobayashi

(10) Patent No.: US 11,908,635 B2
(45) Date of Patent: Feb. 20, 2024

(54) CAPACITOR AND METHOD FOR PRODUCING SAME, AND CAPACITOR-MOUNTING METHOD

(71) Applicant: NIPPON CHEMI-CON CORPORATION, Tokyo (JP)

(72) Inventor: Kentaro Kobayashi, Tokyo (JP)

(73) Assignee: NIPPON CHEMI-CON CORPORATION, Tokyo (JP)

( * ) Notice: Subject to any disclaimer, the term of this patent is extended or adjusted under 35 U.S.C. 154(b) by 122 days.

(21) Appl. No.: 17/616,551

(22) PCT Filed: May 1, 2020

(86) PCT No.: PCT/JP2020/018473
§ 371 (c)(1),
(2) Date: Dec. 3, 2021

(87) PCT Pub. No.: WO2020/246195
PCT Pub. Date: Dec. 10, 2020

(65) Prior Publication Data
US 2022/0238283 A1    Jul. 28, 2022

(30) Foreign Application Priority Data

Jun. 6, 2019   (JP) .............................. 2019-106568
Feb. 7, 2020   (JP) .............................. 2020-019994

(51) Int. Cl.
*H01G 9/10*   (2006.01)
*H01G 2/06*   (2006.01)
(Continued)

(52) U.S. Cl.
CPC ............... *H01G 9/10* (2013.01); *H01G 2/02* (2013.01); *H01G 2/06* (2013.01); *H01G 2/065* (2013.01); *H01G 2/10* (2013.01); *H01G 9/008* (2013.01)

(58) Field of Classification Search
None
See application file for complete search history.

(56) References Cited

U.S. PATENT DOCUMENTS

2012/0077356 A1*   3/2012   Shimizu ................... H01G 2/06
                                                                 439/55

FOREIGN PATENT DOCUMENTS

JP   59-149090   8/1984
JP   6-61106    3/1994
(Continued)

OTHER PUBLICATIONS

International Search Report for PCT/JP2020/018473 dated May 26, 2020, 7 pages.
(Continued)

*Primary Examiner* — Eric W Thomas
(74) *Attorney, Agent, or Firm* — NIXON & VANDERHYE

(57) ABSTRACT

To reduce the occurrence of capacitor mounting failure on a circuit board in the solder reflow process, the capacitor element is housed in the bottomed cylindrical outer case and sealed with a sealing member the open end of the outer case, the lead terminal derived from the capacitor element is formed through the sealing member a capacitor body, a base having a bottom surface portion and a side wall formed so as to surround the outer periphery of the capacitor body with a through hole through which the lead terminal penetrates, a capacitor having a convex portion protruding toward the capacitor body from the inner surface of the side wall, the caulking portion formed by caulking the side surface of the outer case the convex portion is disposed, providing a gap portion between the caulking portion and the convex portion.

9 Claims, 11 Drawing Sheets

(51) Int. Cl.
*H01G 9/008* (2006.01)
*H01G 2/10* (2006.01)
*H01G 2/02* (2006.01)

(56) References Cited

FOREIGN PATENT DOCUMENTS

| | | |
|---|---|---|
| JP | 9-64526 | 3/1997 |
| JP | 10-199772 | 7/1998 |
| JP | 11-87895 | 3/1999 |
| JP | 2001-102237 | 4/2001 |
| JP | 2001-217148 | 8/2001 |
| JP | 2007-317688 | 12/2007 |
| JP | 2012-74561 | 4/2012 |
| JP | 2013-235968 | 11/2013 |
| WO | WO-2015001842 A1 * 1/2015 | ............. H01G 11/08 |

OTHER PUBLICATIONS

Written Opinion of the ISA for PCT/JP2020/018473 dated May 26, 2020, 5 pages.

* cited by examiner

[Fig. 1A]
(a)
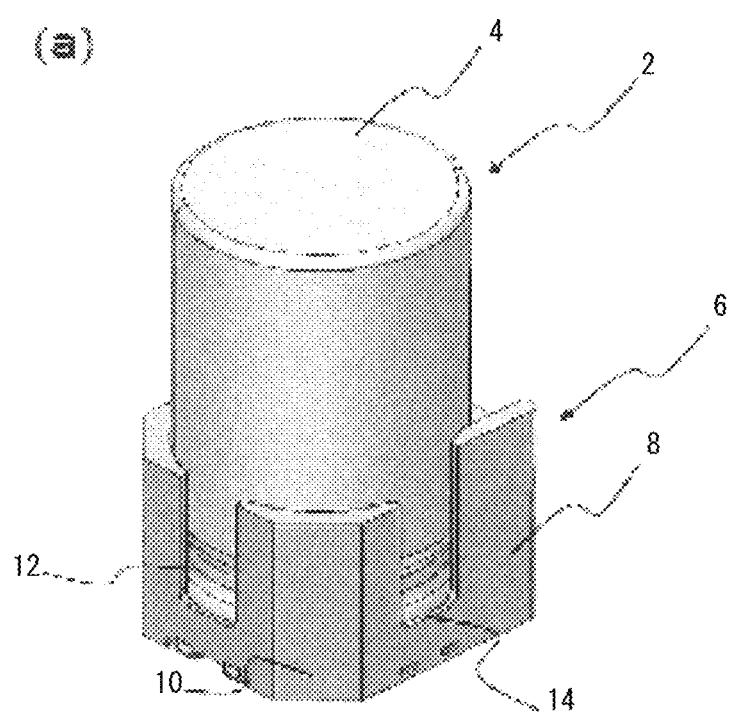

[Fig. 1B]
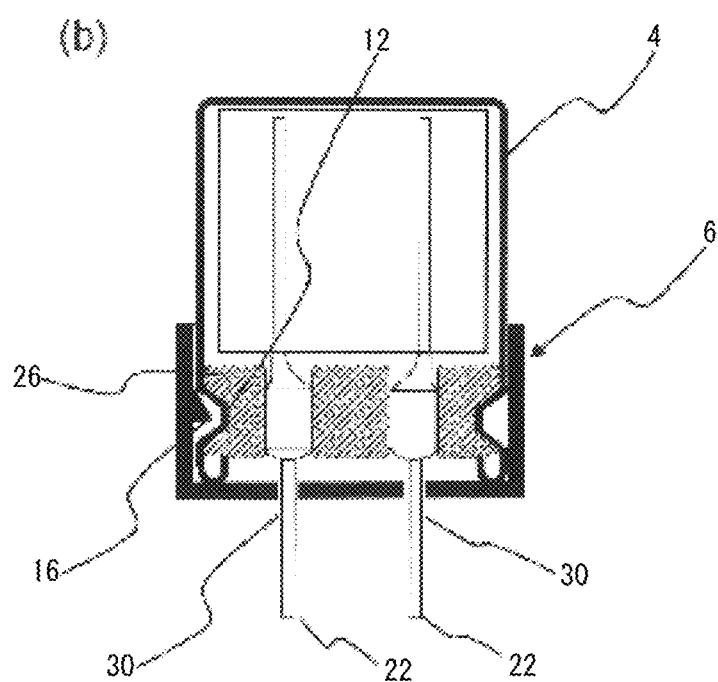

[Figure 2]
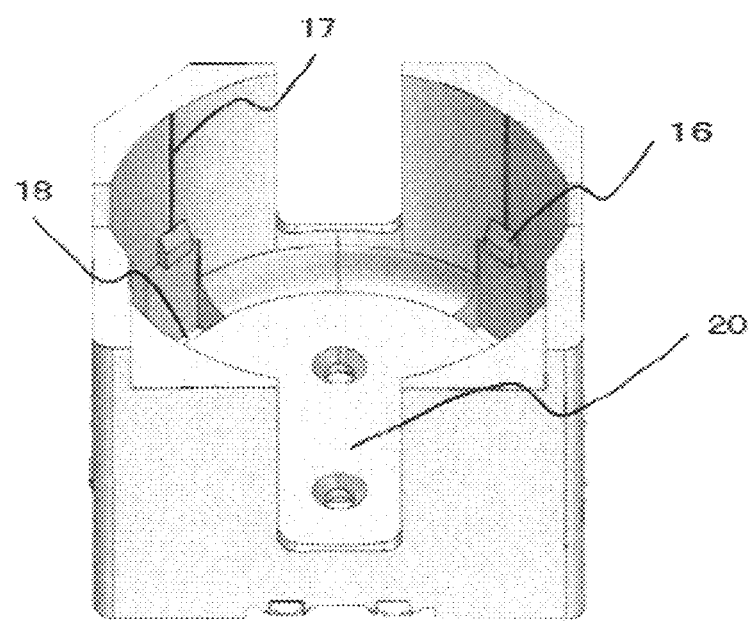

[Figure 3]
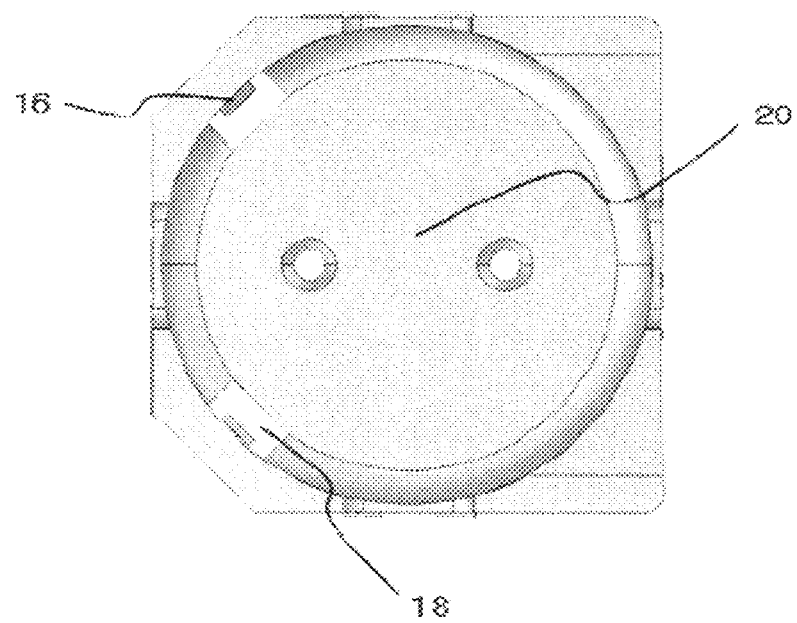

[Figure 4]
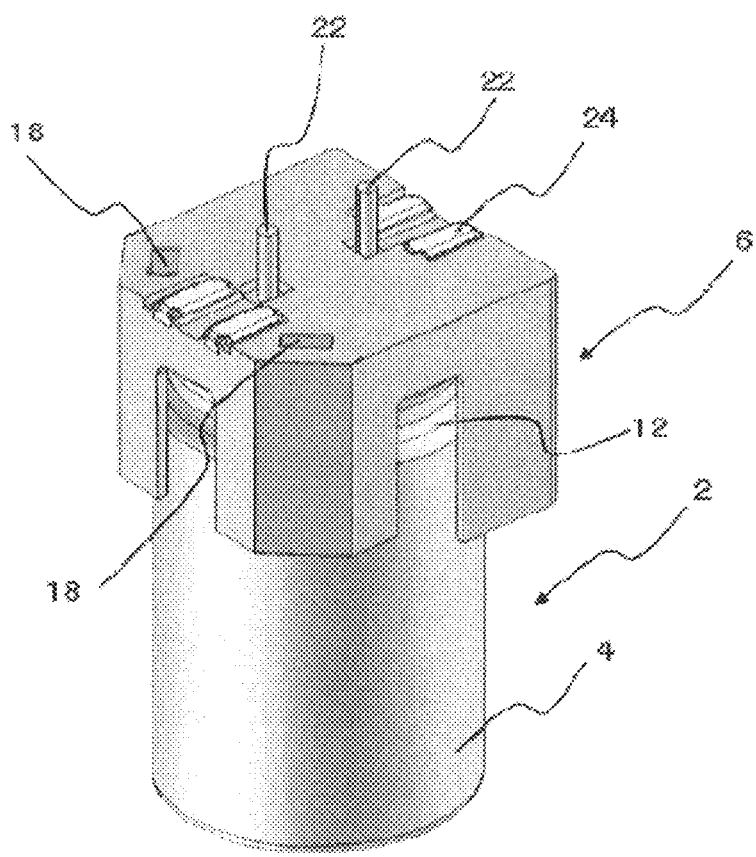

[Fig. 5A]
(a)
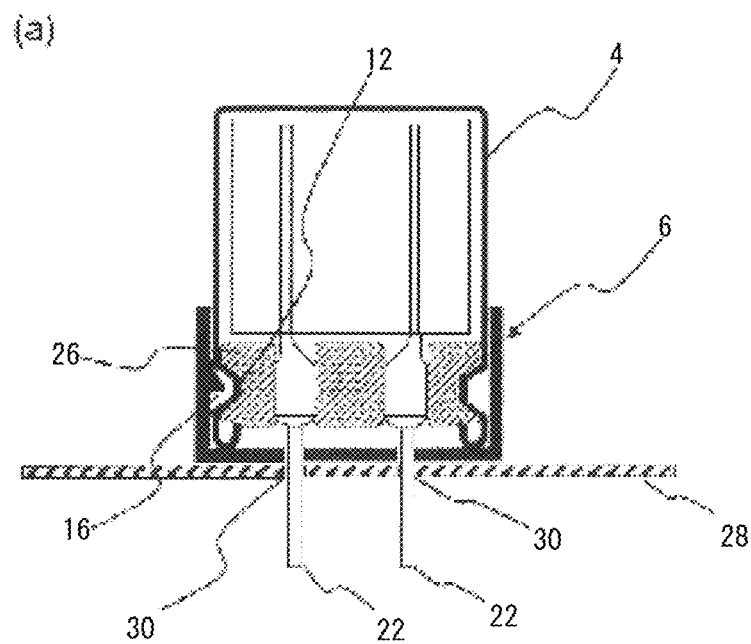

[Fig. 5B]
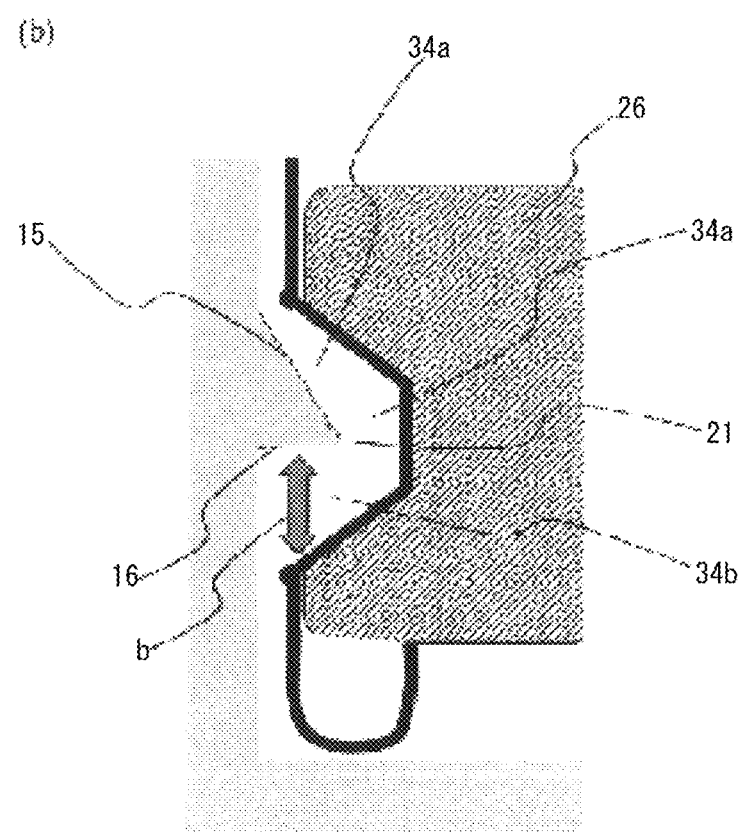

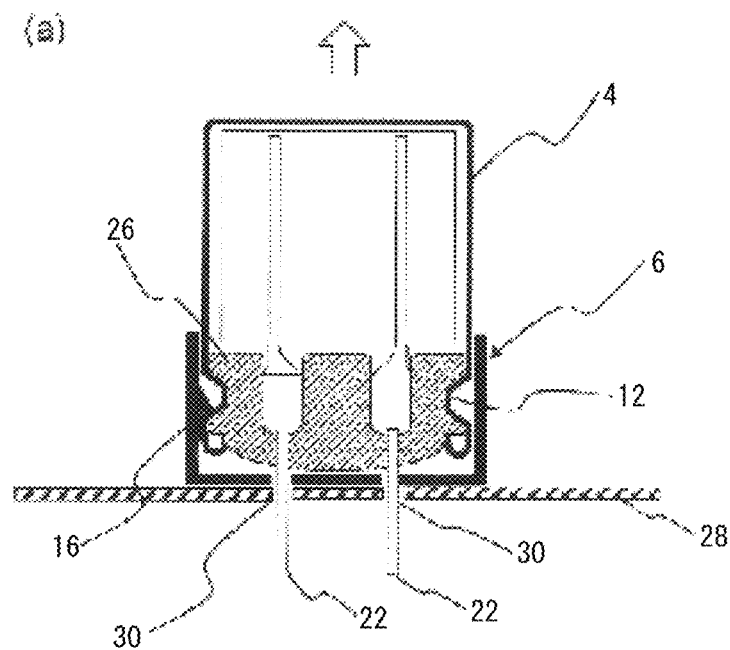
[Fig. 6A]

[Fig. 6B]
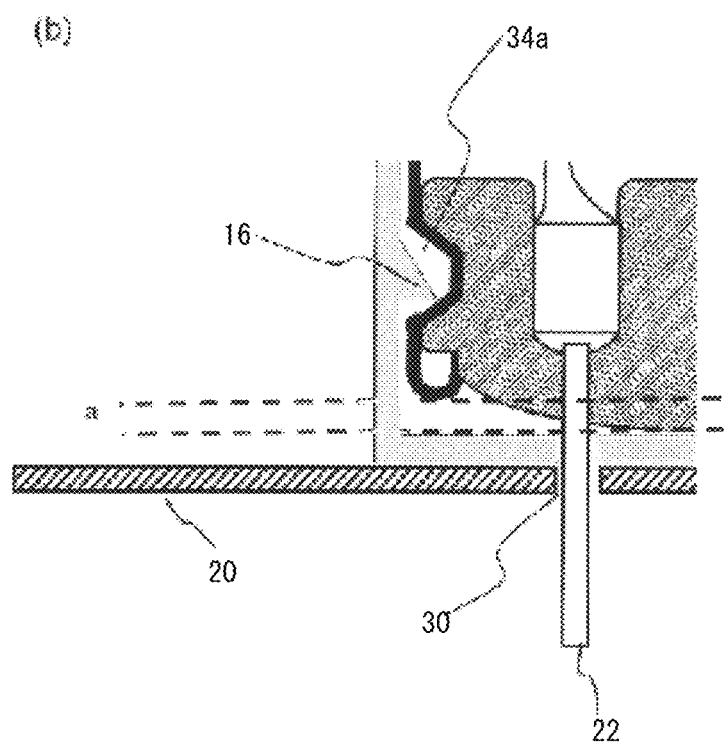

[Figure 7]
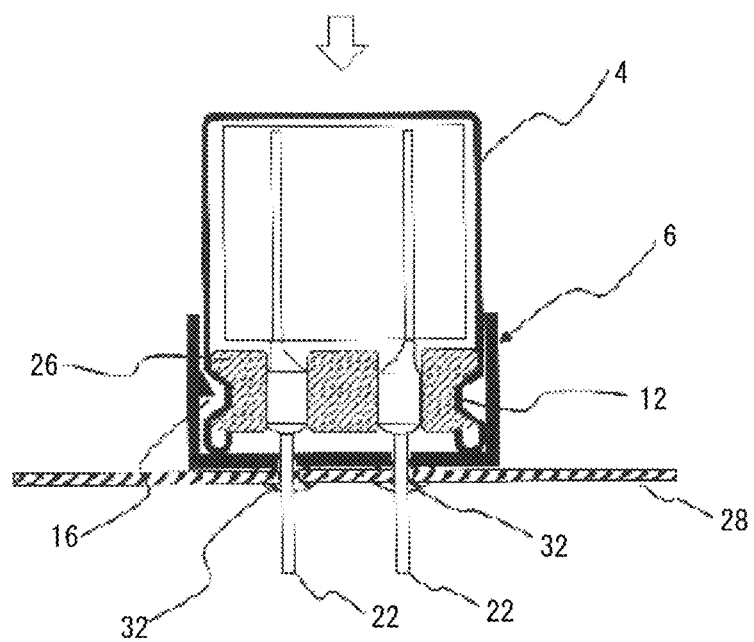

[Figure 8]
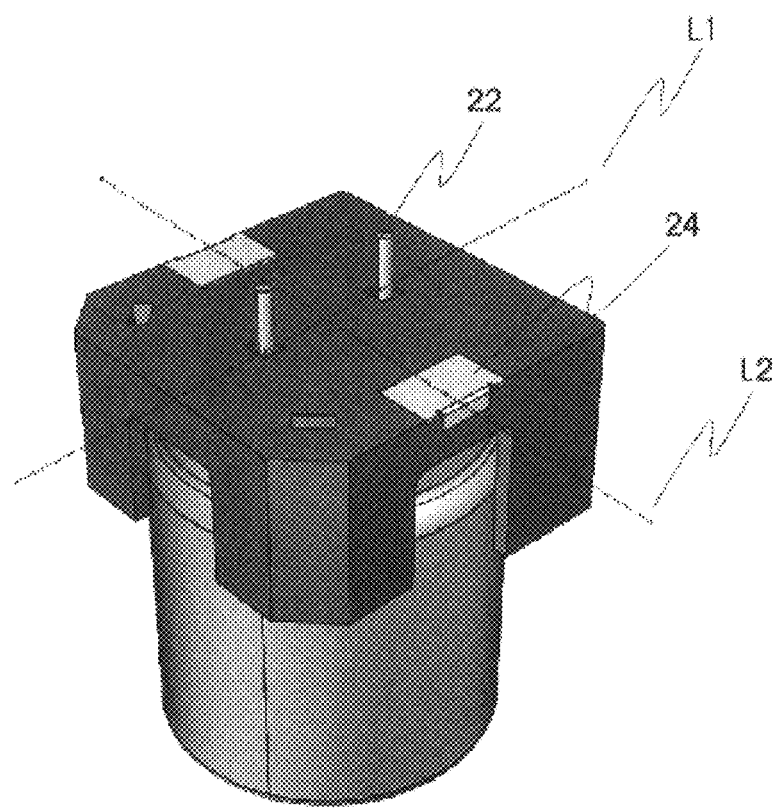

CAPACITOR AND METHOD FOR PRODUCING SAME, AND CAPACITOR-MOUNTING METHOD

CROSS-REFERENCE TO RELATED APPLICATION

This application is the U.S. national phase of International Application No. PCT/JP2020/018473 filed May 1, 2020 which designated the U.S. and claims priority to JP Patent Application No. 2019-106568 filed Jun. 6, 2019 and JP Patent Application No. 2020-019994 filed Feb. 7, 2020, the entire contents of each of which are hereby incorporated by reference.

BACKGROUND OF THE INVENTION

Field of the Invention

The present invention relates to a capacitor mounted on a wiring board such as a circuit board, for example, a chip-type electrolytic capacitor in which as pedestal is disposed on the sealing member side for sealing the metal outer case of the capacitor, and a manufacturing method thereof the mounting method of the capacitor.

Description of the Related Art

For example, there is a chip-type electrolytic capacitor as one of the capacitors constituting the power storage device constituting the control circuit in the power converter. In the chip-type electrolytic capacitor, an anode lead wire and a cathode lead wire is respectively connected to the anode foil and the cathode foil and wound by interposing a separator therebetween housed in the outer case made of a cylindrical metal with the driving electrolyte, the open end of the outer case sealed by a sealing member to the outer case in which it is configured by caulking, mounting an insulating pedestal having a through hole, penetrating a pair of lead terminals derived from the capacitor body in the through hole, and by bending along the lower surface of the pedestal, this configuration is compatible with surface mounting. Further there is also a method of soldering by through the solder reflow process to the through hole provided on the circuit board, without bending a pair of lead terminals derived from the through hole of the insulating plate.

The following literature is known as a referential document disclosing a chip-type electrolytic capacitor having such an insulating pedestal.
[Patent Document 1] JP 2001-102237

Chip type electrolytic capacitor holds the internal driving electrolyte as before described and when exposed to a high temperature state by the solder reflow process, solvent of the driving electrolyte is vaporized to increase the internal pressure of the electrolytic capacitor. Then, with the increase in internal pressure, by the sealing member is expanded to the insulating plate side, when the insulating plate and the capacitor is connected to the circuit board without soldering well become separated, lowering the connection strength causes, there is a problem such as the electrolytic capacitor falls off from the substrate during actual use.

In view of the foregoing problems an object of the present invention is to provide a capacitor capable of greatly reducing the occurrence of mounting failure on the circuit board in the solder reflow process.

SUMMARY OF THE INVENTION

Capacitor of the present invention, characterized in that the open end of the bottomed cylindrical outer case housing the capacitor element is sealed with a sealing member, the lead terminal derived from the capacitor element is formed through the sealing member a capacitor body, the lead terminal is housed in a pedestal having a bottom portion and a side wall formed so as to surround the outer periphery of the capacitor body with a through hole penetrating, a capacitor having a convex portion protruding toward the capacitor body from the inner surface of the side wall, the convex portion is disposed on the caulking portion formed by caulking the side surface of the outer case and a gap portion is provided between the caulking portion and the convex portion.

The present invention provides a method of manufacturing a capacitor in which the open end of the bottomed cylindrical outer case housing the capacitor element is sealed with a sealing member, the lead terminal derived from the capacitor element is formed through the sealing member a capacitor body, the lead terminal is housed in a pedestal having a bottom portion and a side wall formed so as to surround the outer periphery of the capacitor body having a through hole penetrating, a method of manufacturing a capacitor having a convex portion protruding toward the capacitor body from the inner surface of the side wall, the caulking portion formed by caulking the side surface of the outer case, characterized in that the step of arranging the convex portion by providing a gap portion between the caulking portion and the convex portion.

Capacitor of the present invention, a step of inserting the lead terminal of the capacitor into the through hole filled with solder paste providing in the circuit board and a step of solder reflow connection between the lead terminal and the circuit board.

According to the present invention, any of the following effects may be obtained.

(1) Capacitor body may be avoided from separating from the pedestal even if the sealing member is expanded for exposure to a high temperature state by solder reflow process.

(2) It is possible to suppress the occurrence of mounting failure of the capacitor in the solder reflow process.

BRIEF DESCRIPTION OF THE DRAWINGS

FIG. 1A is a diagram showing an example of a capacitor according to the present invention.

FIG. 1B is a diagram showing an example of a capacitor according to the present invention.

FIG. 2 is a diagram showing an example of a pedestal of a capacitor according to the present invention.

FIG. 3 is a diagram showing an example of a pedestal of a capacitor according to the present invention.

FIG. 4 is a diagram showing an example of a capacitor according to the present invention.

FIG. 5A is a diagram showing a cross section of a capacitor before the solder reflow process of the capacitor according to the present invention.

FIG. 5B is a diagram showing a cross section of a capacitor before the solder reflow process of the capacitor according to the present invention.

FIG. 6A is a diagram showing a cross section of the capacitor during the solder reflow process of the capacitor according to the present invention.

FIG. 6B is a diagram showing a cross section of the capacitor during the solder reflow process of the capacitor according to the present invention.

FIG. 7 is a diagram showing a cross section of the capacitor after the solder reflow process of the capacitor according to the present invention.

FIG. 8 is a diagram showing an example of a pedestal of a capacitor according to another embodiment of the present invention.

DESCRIPTION OF THE PREFERRED EMBODIMENTS

Capacitor of the embodiment provides an external shape as shown in FIG. 1A, FIG. 1B and essentially composed of the capacitor body 4 having a lead terminal 22 which is derived through the sealing member 26 for sealing the opening side of the aluminum outer casing for housing the capacitor elements therein and a pedestal 6 disposed on the sealing member 26 side of the capacitor body 4 from which the lead terminal 22 is derived.

Capacitor body 4 used in the embodiment, as shown in FIG. 1A and FIG. 1B is configured like that a bottomed cylindrical aluminum outer case houses the capacitor element therein and after inserting the sealing member 26 to an open end of the case the outer peripheral side surface and the open end in the outer case caulking portion 12 is formed by caulking, thereby the capacitor body 4 is sealed. Lead terminal 22 derived from the capacitor element so as to penetrate the sealing member 26 is provided, the end portion of the lead terminal 22 which is derived to the outside of the sealing member 26 penetrates the through hole formed in the pedestal 6 (not shown). The sealing member 26 is formed of a hardness which exhibits flexibility and elasticity, and for example, ethylene propylene rubber, butyl rubber, silicones rubber, or the like is used.

The capacitor element, by interposing a separator between the anode foil and the cathode foil made of a valve metal such as aluminum, is formed by winding and impregnated with electrolytic solution a conductive polymer such as Pothiethylenedioxythiophene as an electrolyte or the conductive polymer may be used as hybrid type for impregnating the electrolyte into the impregnated capacitor element.

The pedestal 6 disposed on the sealing member 26 side of the capacitor body 4 is made of a resin having an electrically insulating property of a predetermined thickness, as shown in FIGS. 1A and 1B, and a side wall 8 extending upward is formed so as to surround the bottom surface portion 20 on which the sealing member 26 side of the capacitor body 4 abuts and the outer peripheral side surface of the capacitor body 4. The pedestal 6 is a top view substantially rectangular, and notches 10 are formed in a pair of corners adjacent thereto. Thus, it is preferable to form the upper view shape of the pedestal 6 in a substantially rectangular shape, since it is possible to reduce the mounting area of the resulting capacitor to the substrate, the present invention is not limited thereto, top view may be polygonal or circular shape so that the shape of these pedestals 6 may be appropriately selected. Further, a notch 10 is preferably provided in the side wall 8 of the pedestal 6 to conveniently determine the polarity of the lead terminal 22 when the capacitor is mounted to the substrate although free of notches 10 is possible.

In the embodiment, the dividing portion 14 for dividing the side wall 8 of the pedestal 6 is formed, to provide a gap between the inner surface and the outer peripheral side surface of the capacitor body 4 of the side wall 8, so that the outside air from the dividing portion 14 flows efficiently with preferable suppress of the reduction of the heat dissipation effect by the side wall 8 as much as possible, but the present invention is not limited thereto may particularly be formed.

A shown in FIG. 2 and FIG. 3, the inner surface of the side wall 8 of the pedestal 6 surrounds the casing side surface of the capacitor and protrudes to the capacitor body 4 side by providing a convex portion 16 disposed in the caulking portion 12 of the outer case is provided.

As shown in FIG. 1B, when the capacitor body 4 is mounted to the pedestal 6 providing the convex portion 16, the convex portion 16 is disposed in the caulking portion 12 formed by caulking in the side surface of the outer case and a 16 gap portion 34 is provided between the caulking portion 12 and the convex portion. The gap portion 34 is provided on at least one of the upper and lower caulking portions 12 of the convex portion 16 in the axial direction of the capacitor body 4 as shown in FIG. 5B and the gap portion 34b is provided on the lower side of the gap portion 34a and the convex portion 16 on the upper side of the convex portion 16 between the caulking portion 12 and the convex portion 16 in the capacitor 2 of the embodiment and the capacitor body 4 is housed in the axially movable pedestal 6 of the capacitor body 4 through the gap portion 34.

Further, it is preferable to provide the gap portion 34c between the caulking portion 12 in the diameter direction of the end portion 21 and the capacitor body 4 of the convex portion 16. Smooth movement in the axial direction of the capacitor body 4 may be attained by a non-contact of an end portion 21 of the convex portion 16 with the caulking portion 12.

In the embodiment capacitor 2 the caulking portion 12 of the capacitor body 4 is movable in the vertical direction on the base of the convex portion 16 of the pedestal 6, so that the capacitor body 4 and the pedestal 6 are integrated for movable up and down through the gap 34. Thus, even if the capacitor body 4 with deformation of the sealing member 26 by the solder reflow process is pushed up from the pedestal 6, the movement may be allowable in the gap 34 and the convex portion 16 and the caulking portion may be suppressed from coming off with improvement in the reliability of the connection between the lead terminal 22 and the circuit board 28.

Further, as shown in FIG. 5A and FIG. 5B, when the sealing member 26 side of the capacitor body 4 is contacted to the bottom surface portion 20 of the pedestal 6 for housing in the pedestal 6 a gap portion 34a it is preferably provided on the convex portion 16 in the axial direction of the capacitor 2. By providing the gap portion 34a, the convex portion 16 becomes non-contact with the caulking portion 12 without any application of excessive stress to the caulking portion 12 for sealing the capacitor body 4. In addition, the gap portion 34a allows a fine difference in dimensions of the caulking portion 12 of the individual capacitors with enhancement reliably of accommodation of the capacitor body 4 to the bottom portion 20 of the pedestal 6.

Further, the convex portion 16 is formed in a tapered portion 15 toward the bottom from the opening side of the pedestal 6. Thus it is possible to assist the storage of the capacitor body 4 in the pedestal 6. Furthermore, a locking portion 19 for suppressing undesired escape of the capacitor body 4 housed is formed on the convex portion 16.

Thus, the capacitor body 4 with deformation of the sealing member 26 by the solder flow may be suppressed from movement in the direction in which the caulking portion 12 comes out contact with the locking portion even when spaced from the pedestal 6.

The convex portion 16 may be formed at least one location on the inner surface of the side wall 8. In the embodiment, the convex portions 16 as shown in FIG. 3 are formed at two positions perpendicular to the upper surface when observed with respect to the central axis of the capacitor body 4. When a plurality of convex portions 16 are arranged, it is preferable not to form at a position opposed to each other via the central axis of the capacitor body 4. If the pedestal 6 disposed so as to face the convex portions 16 through the central axis of the capacitor body 4, the convex portions 16 are narrowed with respect to the diameter of the capacitor housing portion cracking or damage is likely developed in the pedestal 6 when attempting to accommodate the capacitor body 4 to the pedestal 6.

Further, as shown in FIG. 3, provision is made of an opening 18 in the bottom surface portion 20 of the pedestal 6 located below the axial direction of the capacitor of the convex portion 16 provided on the side wall 8. The convex portion 16 along the tapered portion 15 when the capacitor body 4 in contact with the capacitor body 4 is inserted into the pedestal 6 to the convex portion 16 is elastically deformed in the radial direction as a stress is applied to the pedestal 6. Therefore, by forming the opening 18 in the bottom surface portion 20 of the pedestal 6 located below the axial direction of the capacitor of the convex portion 16 provided on the side wall 8, the stress escapes to the peripheral portion of the opening 18 so that possible cracking and breakage of the pedestal 6 may be relieved.

Further, as shown in FIG. 2, the ribs 17 projecting inwardly over the vertical direction are provided at four positions at equal intervals on the inner surface of the side wall 8. The separation width between the tips of the pair of ribs 17 positioned so as to face each other is formed so as to be slightly shorter than the diameter of the capacitor body 4.

The rib 17 may be formed above the axial direction of the capacitor body 4 of the convex portion 16. Thus, when the capacitor body 4 is accommodated to the pedestal 6, the rib 17 serves to guide the capacitor body 4 and stably housed in the pedestal 6 and the convex portion 16 is formed below the axial direction of the capacitor body 4 of the rib 17 for continuous guide from the rib 17 and the convex portion 16 is disposed with a gap portion 34 to the caulking portion 12 provided in the capacitor body 4.

Thus in this embodiment, the rib 17 is formed over the vertical direction of the inner surface of the side wall 8, the outer peripheral side surface of the capacitor body 4 is supported over the top and bottom of the side wall 8, the oscillation of the capacitor body 42 it is preferable because it is possible to more effectively suppress, the present invention is not limited thereto, it may be formed on at least a portion of the inner surface of the side wall 8.

Although the upper surface view shape of the rib 17 is preferably formed in a semicircular shape, the present invention is not limited thereto, the shape as long as at least the tip is formed so as to be in contact with the outer peripheral side surface of the capacitor body 4.

Further, the ribs 17 are provided at four positions at equal intervals on the inner surface of the side wall 8, and is formed so as to be a position facing each other, so that the capacitor body 4 is uniformly sandwiched, and more stably supported, notwithstanding the present invention is not intended to be limited thereto, the capacitor body 4 is provided on the side wall 8 as long as it is adapted to be sandwiched between the ribs 17 and the number as well as the formation position may be appropriately selected.

In the capacitor 2 thus constructed, by mounting the capacitor body 4 inside the rib 17 provided on the inner surface of the side wall 8, the tip of the rib 17 is pressed against the outer peripheral side surface of the capacitor body 4 and elastically deformed on the side wall 8 side and the outer peripheral side surface of the capacitor body 4 by its elastic repulsive force as sandwiched strongly with the tips of the ribs 17, so that an oscillation of the capacitor body 4 even during excitation, breakage of the lead terminal 22 due to oscillation of the capacitor body 4 may be suppressed. Further, since the rib 17 is configured integrally with the side wall 8 for excellent strength with reduction of the manufacturing cost of the side wall 8.

Furthermore, the capacitor body 4 is supported by the ribs 17, so that the gap is formed between the outer peripheral side surface and the side wall 8 of the capacitor body 4, lowering of the heat dissipation of the capacitor body 4 by providing the side wall 8 may be suppressed as much as possible.

Further, as shown in FIG. 4, it may be connected by a solder reflow process inserted into the through hole 30 without bending a pair of lead terminals 22 derived from the capacitor body 4. Thus, it is possible to avoid the concentration of stress on the lead terminal 22 that occurs when the lead terminal 22 is bent.

Further since the lead terminal 22 is fixed in the through hole 30, the capacitor and the circuit board 28 as compared with a general surface-mounted product that does not insert the lead terminal 22 into the through hole 30 and may be firmly connected.

In the embodiment, it is preferable to provide an auxiliary terminal 24 for stronger connection between the pedestal 6 and the circuit board 28 on the lower surface of the pedestal 6, notwithstanding the present invention is not limited thereto, it may not be particularly formed.

Further, according to another embodiment using the auxiliary terminal as shown in FIG. 8 including a virtual line L1 connecting a pair of lead terminals derived from the capacitor body and a virtual line L2 connecting a pair of auxiliary terminals disposed on the lower surface of the pedestal 6, the contact point of the angle may be arranged auxiliary terminals so as to have a relationship substantially perpendicular. The direction of the imaginary line L1 may ensure a high vibration resistance as fixed to the substrate at two points by a pair of lead terminals. Similarly, the direction of the virtual line L2 ensures a high vibration resistance as fixed to the substrate at two points by a pair of auxiliary terminals. It is possible to ensure high vibration resistance to vibration from a plurality of directions by arranging the auxiliary terminals so that the respective virtual lines are arranged in different directions (e.g., perpendicular direction).

Capacitor 2 configured as described hereinbefore is connected by soldering to a predetermined position of the circuit board 28. A through hole 30 provided in the circuit board 28 is filled with solder paste, and the lead terminal 22 of the capacitor is inserted into the through hole 30. When sufficiently inserted the sealing member 26 side of the capacitor body 4 and the bottom portion 20 of the pedestal 6 are made in contact to determine the height and the gap portion 34b are provided the gap portion 34a above and below the convex portion 16 in the axial direction of the capacitor body 4. As shown in FIG. 5A and FIG. 5B, the convex portion 16 as shown in FIG. 5B is disposed above the caulking portion inner region occurring between the pedestal 6 and the caulking portion 12 and the gap portion 34b is provided below the caulking portion 12 as a space portion for allowing the movement of the capacitor body 4 due to the deformation of the sealing member 26.

As shown in FIG. 5A and FIG. 5B, when the solder reflow process is started a slight individual difference by the capacitor 2 as shown in FIG. 6A diagram FIG. 6B is developed like that the sealing member 26 with the internal pressure rise of the capacitor 2 is expanded to push up the capacitor body 4 in a direction away from the bottom surface portion 20 of the pedestal 6 (FIG. 6A arrow direction). However, since the convex portion 16 is controlled in the caulking portion 12 of the capacitor body 4 with upward movement of the caulking portion 12 by the gap portion 34b disposed below the convex portion 16 in the axial direction of the capacitor body 4, separation of the capacitor from the pedestal 6 may be suppressed. Thus as shown in FIG. 6A and FIG. 6B, capacitor body 4 is pushed up, the convex portion 16 is positioned below the caulking portion inner area. Further, the height of the pushed up capacitor provides the gap portion 34a above the convex portion 16. Although the height of the capacitor body 4 pushed up by the expansion of the sealing member 26 is slightly different according to the individual difference of the capacitor 2, as shown in FIG. 6B, the capacitor body 4, when housed in the pedestal 6 is made into contact with the bottom surface portion 20 of the pedestal 6 by deformation of the sealing member 26 caused due to the solder reflow process and the capacitor body 4 is spaced apart from the bottom surface portion 20 of the pedestal 6 providing the lengths and when housed in the pedestal 6 by contacting the capacitor body 4 shown in FIG. 5B to the bottom surface portion 20 of the pedestal 6 providing, the length b of the gap portion 34b provided under the convex portion 16 in the axial direction of the capacitor in order to design the position of the convex portion 16 or the caulking portion as the formula a≤b. Thus, it is possible to positively allow the movement of the capacitor 4 in association with the solder reflow process with the caulking portion 12.

Further, when the capacitor body 4 shown in FIG. 5B is housed in the pedestal 6 by contacting with the bottom surface portion 20 of the pedestal 6, the length b of the gap portion 34b provided under the convex portion 16 in the axial direction of the capacitor 2 is preferably about 0.2 mm~3.0 mm, more preferably about 0.5 mm~2.0 mm and it may appropriately be designed according to the size of the capacitor body 4 and the depth of the caulking portion 12.

When the condenser 2 is cooled in the cooling step of the solder reflow process, the sealing member 26 involving the is slight individual difference by the condenser 2 expanded is contracted as shown in FIG. 7 and the condenser body 4 is lowered by its own weight for the height in the amount of contraction the sealing member 26. The solder solidifies and is mechanically and electrically interconnected. At this time, depending on the degree of adhesion between the rib 17 provided in the capacitor body 4 and the side wall 8 may connect the lead terminal 22 to the circuit board 28 in a state where the capacitor body 4 is provided with a slight clearance without descending to the bottom surface portion 20 of the pedestal 6 free of influence for the mounting operation on the circuit board 28.

As hereinbefore described, although an example of the present invention has been described with drawings, specific feature is not limited to those examples, and any change and addition in the range which does not deviate from the summary of the present invention shall be included in the present invention.

For example, in the present embodiment, the method of implementing the capacitors 2 on the circuit board 28 after insertion of the lead terminal 22 of the condenser body 4 into the through-hole 30 provided on the circuit board 28 and the molding method to be carried out by rubber reflow processing with sufficient pushing into contact with the encapsulating member 26 side and the base 20 of the seat 6 of the condenser body 4 are described, notwithstanding the present invention shall not be limited to those. After insertion of the lead terminal 22 of the condenser body 4 into the through-hole 30 provided on the circuit board 28 as the method of implementing the capacitors may be carried out by a rubble reflow process with previous separation of the encapsulating member 26 side of the condenser body 4 and the base 6 and the base 20 of the base. Specifically the capacitor body is pulled upward within a range in which the convex portion 16 provided in the pedestal 6 is disposed in the caulking portion 12 provided in the capacitor body 4 and the convex portion 16 may be disposed under the inner region of the caulking portion 12.

Thus, the sealing member 26 side and the pedestal 6 of the capacitor body 4 is spaced apart in advance to expand the gap or provide a gap between the sealing member 26 and the pedestal 6 for deformation of the sealing member 26 by applying the solder reflow process thereby the deformation is absorbed into the gap. As compared with the solder reflow process in a state where the bottom surface portion 20 of the sealing member 26 and the pedestal 6 are made into contact, it is possible to eliminate or reduce the movable distance above the capacitor body. The shorter movable distance upward of the capacitor body 4 with the solder reflow process may reduce the load on the lead terminal 22. That is, the gap portion 34 provided between the convex portion 16 of the caulking portion 12 and the pedestal 6 of the capacitor body 4 may move the capacitor body 4 in the vertical direction. The size and the sealing member 26 of the capacitor 2 material, depending on the mounting equipment or the like, the distance between the capacitor body 4 and the pedestal 6 during the solder reflow process may be appropriately selected.

According to the present invention, it is possible to significantly reduce the occurrence of mounting failure on the circuit board 28 in the solder reflow.

IDENTIFICATION OF REFERENCE NUMERALS

2 Capacitor
4 Capacitor body
6 Pedestal
8 Side wall
10 Notch
12 Caulking part
14 Division part
15 Tapered portion
16 Convex part
17 Rib
18 Opening
19 Locking part
20 Bottom part
22 Lead terminals
24 Auxiliary terminal
26 Sealing member
28 Circuit boards
30 Through hole
32 Solder paste
34 Gap

The invention claimed is:

1. A capacitor, comprising:
   a capacitor element housed in a bottomed cylindrical outer case, an open end of the cylindrical outer case being sealed with a sealing member;
   a capacitor body providing a lead terminal derived from the capacitor element through the sealing member, the lead terminal being housed in an axially movable pedestal having a bottom surface portion and a side wall formed to surround the outer periphery of the capacitor body having a through hole; and
   a convex portion protruding toward the capacitor body from the inner surface of the side wall,
   wherein the convex portion is disposed on at least one of an upper caulking portion and a lower caulking portion formed by caulking the side surface of the outer case, a gap portion being provided between (i) at least one of: the upper caulking portion and the lower caulking portion, and (ii) the convex portion, and
   wherein the gap portion is provided on the at least one of the upper caulking portion and the lower caulking portion of the convex portion in the axial direction of the capacitor body, the capacitor body being housed in the axially movable pedestal of the capacitor through the gap portion.

2. The capacitor according to claim 1,
   wherein the capacitor body housed in the pedestal is in contact with the bottom surface portion of the pedestal, the length a of the capacitor body is spaced from the bottom surface portion of the pedestal by deformation of the sealing member due to solder reflow, and
   the capacitor body housed in the pedestal is made into contact with the bottom surface portion of the pedestal and the magnitude relationship between the length b of the gap portion provided under the convex portion in the axial direction of the capacitor is a≤b.

3. The capacitor according to claim 1,
   wherein the convex portion includes a tapered portion provided above in the axial direction of the capacitor under the axial direction of the capacitor and a locking portion configured to suppress the escape of the housed capacitor body.

4. The capacitor according to claim 1,
   wherein the inner surface of the side wall provides a rib projecting inwardly over the axial direction of the capacitor body, the rib being formed above the axial direction of the capacitor body of the convex portion.

5. The capacitor according to claim 1,
   wherein the pedestal provides an opening in the bottom surface of the pedestal located below the axial direction of the capacitor of the convex portion provided on the side wall.

6. The capacitor according to claim 1,
   wherein the lead terminal of the capacitor body passes through the through hole provided in the pedestal and derived linearly.

7. A method of manufacturing a capacitor in which an open end of the bottomed cylindrical outer case housing the capacitor element is sealed with a sealing member, a lead terminal is derived from a capacitor element of a capacitor body formed through the sealing member, the lead terminal is housed in a pedestal having a bottom surface portion and a side wall formed to surround the outer periphery of the capacitor body having a through hole, and a convex portion is protruded toward the capacitor body from the inner surface of the side wall, the method comprising:
   placing the convex portion by providing a gap portion between (i) at least one of a first caulking portion and a second caulking portion of the convex portion, and (ii) the convex portion to the at least one of the first caulking portion and the second caulking portion formed by caulking the side surface of the outer case.

8. The method for mounting a capacitor according to claim 7, further comprising:
   inserting the lead terminal of the capacitor in the through hole of a circuit board and filling the through hole with solder paste, and
   providing a solder reflow connection between the lead terminal and the circuit board.

9. The method for mounting a capacitor according to claim 8,
   wherein, after the inserting the lead terminal of the capacitor into the through hole, temporarily fixing the lead terminal by bending the inserted lead terminal.

* * * * *